(12) United States Patent
Lee

(10) Patent No.: US 12,103,729 B2
(45) Date of Patent: Oct. 1, 2024

(54) SUBSTRATE TRAY

(71) Applicant: AMOGREENTECH CO., LTD., Gimpo-si (KR)

(72) Inventor: Ji Hyung Lee, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 148 days.

(21) Appl. No.: 17/904,130

(22) PCT Filed: Jan. 28, 2021

(86) PCT No.: PCT/KR2021/001175
§ 371 (c)(1),
(2) Date: Aug. 12, 2022

(87) PCT Pub. No.: WO2021/162299
PCT Pub. Date: Aug. 19, 2021

(65) Prior Publication Data
US 2023/0070970 A1    Mar. 9, 2023

(30) Foreign Application Priority Data
Feb. 14, 2020    (KR) .................. 10-2020-0018422

(51) Int. Cl.
*B65D 1/34*    (2006.01)
*B65D 81/02*    (2006.01)
(Continued)

(52) U.S. Cl.
CPC .............. *B65D 1/34* (2013.01); *B65D 81/025* (2013.01); *B65G 49/06* (2013.01); *H05K 13/0061* (2013.01); *B65G 2201/0258* (2013.01)

(58) Field of Classification Search
CPC ...... B65D 85/48; B65D 1/36; B65D 21/0213; B65D 71/70; B65D 71/00; B65D 21/02112; B65D 25/107; B65D 21/0209
(Continued)

(56) References Cited

U.S. PATENT DOCUMENTS 5,011,011 A * 4/1991 Kidd ..................... B65D 85/68
                                                              206/319
6,296,122 B1 * 10/2001 Nakazono .......... B65D 21/0209
                                                              206/707
(Continued)

FOREIGN PATENT DOCUMENTS

GB         2513849 A       11/2014
KR      20100046589 A       5/2010
(Continued)

OTHER PUBLICATIONS

International Search Report issued in PCT/KR2021/001175 dated May 13, 2021, 4 pages.
(Continued)

*Primary Examiner* — Steven A. Reynolds
*Assistant Examiner* — Prince Pal
(74) *Attorney, Agent, or Firm* — ROTHWELL, FIGG, ERNST & MANBECK, P.C.

(57) ABSTRACT

A substrate tray for accommodating at least one ceramic substrate therein including: an accommodation part including a first opening part of which the upper side is open so that the ceramic substrate can be accommodated and withdrawn; and a support part formed on the circumference of the accommodation part so as to support the side wall circumference of the ceramic substrate, wherein the support part includes: an inner wall in contact with at least one surface of the ceramic substrate; an outer wall spaced a predetermined distance from the inner wall; an upper surface
(Continued)

for connecting the inner wall to the outer wall; and a second opening part formed to be open in the direction opposite to the first opening part at a location facing the upper surface between the inner wall and the outer wall.

10 Claims, 8 Drawing Sheets

(51) Int. Cl.
    *B65G 49/06*     (2006.01)
    *H05K 13/00*     (2006.01)
(58) Field of Classification Search
    USPC ............... 206/706, 509, 725, 564, 503, 454
    See application file for complete search history.

(56) References Cited

U.S. PATENT DOCUMENTS

| | | | | | |
|---|---|---|---|---|---|
| 6,837,374 | B2* | 1/2005 | Nigg | ................. | H01L 21/67346 |
| | | | | | 206/509 |
| 7,395,932 | B2* | 7/2008 | Chew | ..................... | B65D 73/02 |
| | | | | | 206/713 |
| 7,520,389 | B2* | 4/2009 | Lalouette | ................. | G06F 1/187 |
| | | | | | 206/320 |
| 7,757,862 | B2* | 7/2010 | Tamura | ............. | H01L 21/67333 |
| | | | | | 206/503 |
| 9,434,509 | B2* | 9/2016 | Bräutigam | ............... | A23F 5/243 |
| D959,270 | S* | 8/2022 | Lee | ................................ | D9/456 |
| 2004/0020823 | A1* | 2/2004 | Yoshizawa | ......... | B65D 21/0213 |
| | | | | | 206/706 |
| 2004/0145697 | A1* | 7/2004 | Yoshizawa | ........ | H01L 21/67346 |
| | | | | | 349/187 |
| 2004/0182742 | A1* | 9/2004 | Bontrager | ............ | B65D 81/025 |
| | | | | | 206/706 |
| 2005/0152121 | A1* | 7/2005 | Yoshizawa | ........... | B65G 49/061 |
| | | | | | 361/728 |
| 2006/0054532 | A1* | 3/2006 | Ochi | ................. | H01L 21/67333 |
| | | | | | 206/518 |
| 2013/0213853 | A1* | 8/2013 | Brautigam | .............. | A23F 5/243 |
| | | | | | 206/706 |
| 2014/0102941 | A1* | 4/2014 | Zhao | ...................... | B65D 85/48 |
| | | | | | 206/706 |
| 2014/0166522 | A1* | 6/2014 | Kuo | ........................ | B65D 81/05 |
| | | | | | 206/454 |
| 2014/0190861 | A1* | 7/2014 | Carrel | ....................... | B01L 9/06 |
| | | | | | 206/518 |
| 2014/0262927 | A1* | 9/2014 | Guo | ..................... | B65D 81/056 |
| | | | | | 206/706 |
| 2014/0332422 | A1* | 11/2014 | Hu | ........................ | B65D 81/05 |
| | | | | | 206/320 |
| 2015/0041361 | A1* | 2/2015 | Hong | .................. | B65D 81/107 |
| | | | | | 206/723 |
| 2016/0001964 | A1* | 1/2016 | Yue | ........................ | B65D 85/48 |
| | | | | | 206/555 |
| 2017/0200928 | A1* | 7/2017 | Yi | ....................... | H01M 50/204 |
| 2023/0135314 | A1* | 5/2023 | Bontrager | ................ | B65D 1/34 |
| | | | | | 206/506 |

FOREIGN PATENT DOCUMENTS

| | | | |
|---|---|---|---|
| KR | 101035628 | B1 | 5/2011 |
| KR | 101893039 | B1 | 10/2018 |

OTHER PUBLICATIONS

Extended European Search Report for European Patent Application No. 21753667.1; dated Feb. 12, 2024 (10 pp).

* cited by examiner

10
SUBSTRATE TRAY

CROSS REFERENCE TO RELATED APPLICATION

This application is a 35 U.S.C. 371 National Phase Entry Application from PCT/KR2021/001175, filed Jan. 28, 2021, which claims the benefit of Korean Patent Application No. 10-2020-0018422 filed on Feb. 14, 2020, the disclosures of which are incorporated herein in their entirety by reference.

TECHNICAL FIELD

The present invention relates to a substrate tray, and more particularly, to a substrate tray capable of storing or transporting a manufactured substrate without damage and contamination.

BACKGROUND ART

When electronic products are produced, circuit boards for mounting components are generally used.

Among components, in the case of a component element emitting a large amount of heat, cooling measures such as heat dissipation are required.

In general, cooling is performed through a cooling fan, a heat sink, a heat pipe, or the like, but in some cases, it is difficult to adopt a cooling device such as a separate cooling fan, heat sink, or heat pipe due to spatial limitations or other limitations. In some cases, an element but also a circuit board requires heat dissipation.

Meanwhile, active metal brazing (AMB) substrates have been recently introduced. Such an AMB substrate is a circuit board in which a metal foil is brazed and formed on one or two surfaces of one surface and the other surface of a ceramic substrate.

Such an AMB substrate has an excellent heat dissipation effect due to the metal foil so that the AMB substrate can be used for power semiconductor mounting substrates or the like in which heat dissipation is important.

After such an AMB substrate is produced, the AMB substrate is transported to a customer. In such a process, scratches or contamination may occur on a surface of the produced AMB substrate, which may cause soldering defects in a subsequent process.

Accordingly, there is a need for a packaging container which can transport a produced AMB substrate without damage, scratches, or contamination.

DISCLOSURE

Technical Problem

The present invention is directed to providing a substrate tray which can transport and store an active metal brazing (AMB) substrate without damage, scratches, or contamination.

It should be noted that objects of the present invention are not limited to the above-described objects, and other objects which have not been described above will be clearly understood by those skilled in the art from the following descriptions.

Technical Solution

According to an embodiment of the present invention, a substrate tray for accommodating one or more ceramic substrates includes an accommodation part which includes a first opening having an upper side that is open such that the ceramic substrate may be accommodated and withdrawn, and a support part formed at a peripheral portion of the accommodation part to support a periphery of a sidewall of the ceramic substrate, wherein the support part includes an inner wall in contact with at least one surface of the ceramic substrate, an outer wall spaced a certain distance from the inner wall, an upper surface configured to connect the inner wall and the outer wall, and a second opening formed to be open in a direction opposite to a direction in which the first opening is open, at a position opposite to the upper surface between the inner wall and the outer wall, and an upper surface of another substrate tray is inserted through the second opening so that a first opening of an accommodation part of the other inserted substrate tray is formed to be closed by the accommodation part of the substrate tray.

A flange portion may be formed to extend outward from a lower end of the outer wall in a direction opposite to the accommodation part.

At least one bottom protrusion may be formed on a bottom surface of the accommodation part.

The bottom protrusion may be formed in a straight line or two straight lines that intersect at a certain angle.

The bottom protrusion may include first bottom protrusions extending radially in a direction from a center of the bottom surface of the accommodation part toward the inner wall at equal angles, second bottom protrusions formed to be perpendicular to the first bottom protrusions which extend to be perpendicular to the inner wall among the first bottom protrusions, and third bottom protrusions formed in a triangular shape at end portions of the first bottom protrusions which extend toward a corner of the inner wall among the first bottom protrusions.

Grip grooves may be formed in the inner wall to pick the ceramic substrate carried in or carried out from the accommodation part.

The grip grooves may be formed at symmetrical positions facing each other.

A corner groove may be formed to be recessed toward the outside of the accommodation part in a corner at a point at which the inner walls meet.

A corner portion of the corner groove may be formed to be curved with a set curvature.

A plurality of outer protrusions vertically having a longitudinal direction may be formed to protrude from an outer surface of the outer wall to be horizontally spaced from each other.

In order to accommodate the outer protrusions, a plurality of outer accommodation grooves vertically having a longitudinal direction may be formed in an inner surface of the outer wall at positions corresponding to the outer protrusions to be spaced a horizontal interval from each other.

A separation interval between the outer wall and the inner wall may be formed in a shape having a wide lower portion and a narrow upper portion that is gradually narrowed toward the upper surface.

Advantageous Effects

According to a substrate tray of the present invention, since an active metal brazing (AMB) substrate is stored in a tray, it is possible to prevent the transmission of an impact from the outside, thereby preventing damage. In addition, since the AMB substrate is loaded to not be shaken in the tray, scratches and the like can be prevented, and contamination caused by the introduction of external materials can be also prevented.

In addition, since an accommodation part can be sealed while substrate trays are stacked, it is possible to seal the substrate trays by stacking the substrate trays without a need for a separate sealing member.

Effects of the present invention are not limited to those described above, and other effects which have not been described above will be clearly understood by those skilled in the art from the description of the claims.

Figure 1:
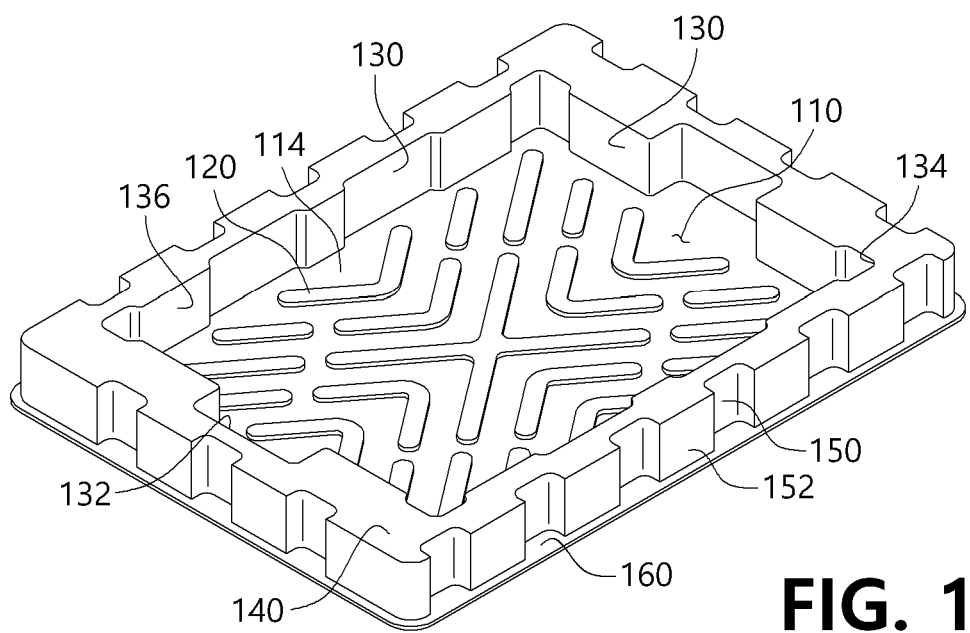
FIG. 1 is a perspective view illustrating a substrate tray according to one embodiment of the present invention.

| | |
|---|---|
| 10: ceramic substrate | 100: substrate tray |
| 110: accommodation part | 112: first opening |
| 114: bottom surface | 120: bottom protrusion |
| 130: inner wall | 132: grip groove |
| 134: corner groove | 136: side protrusion |
| 138: side accommodation groove | 140: upper surface |
| 150: outer wall | 152: outer protrusion |
| 154: outer accommodation groove | 160: flange portion |
| 170: second opening | 180: hollow space |

MODE OF THE INVENTION

Hereinafter, embodiments of the present invention will be described in detail with reference to the accompanying drawings so as to be easily practiced by a person of ordinary skill in the art to which the present invention pertains. It should be understood that the present invention may be embodied in various different forms and is not limited to the following embodiments. Parts irrelevant to description are omitted in the drawings in order to clearly describe the present invention, and like reference numerals refer to like elements throughout the specification. Hereinafter, a substrate tray according to one embodiment of the present invention will be described.

Figure 2:
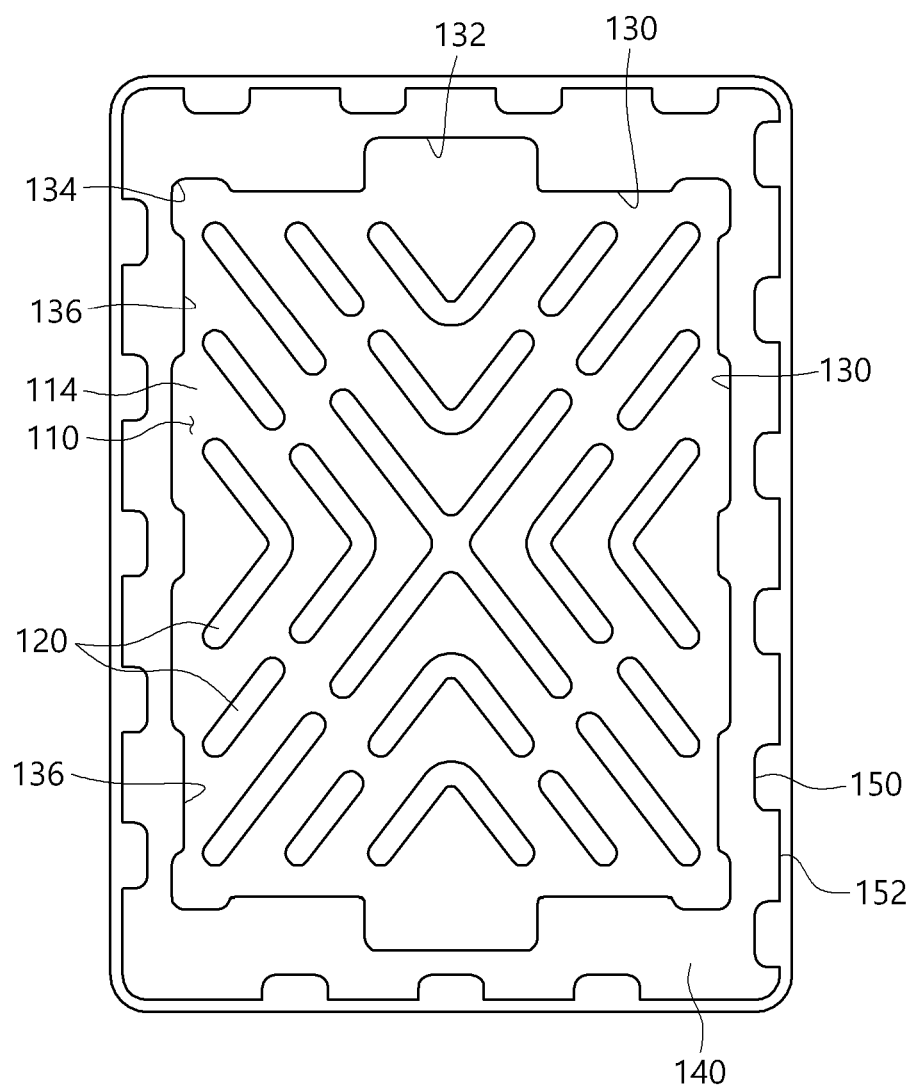
FIG. 2 is a plan view of FIG. 1.
Figure 3:
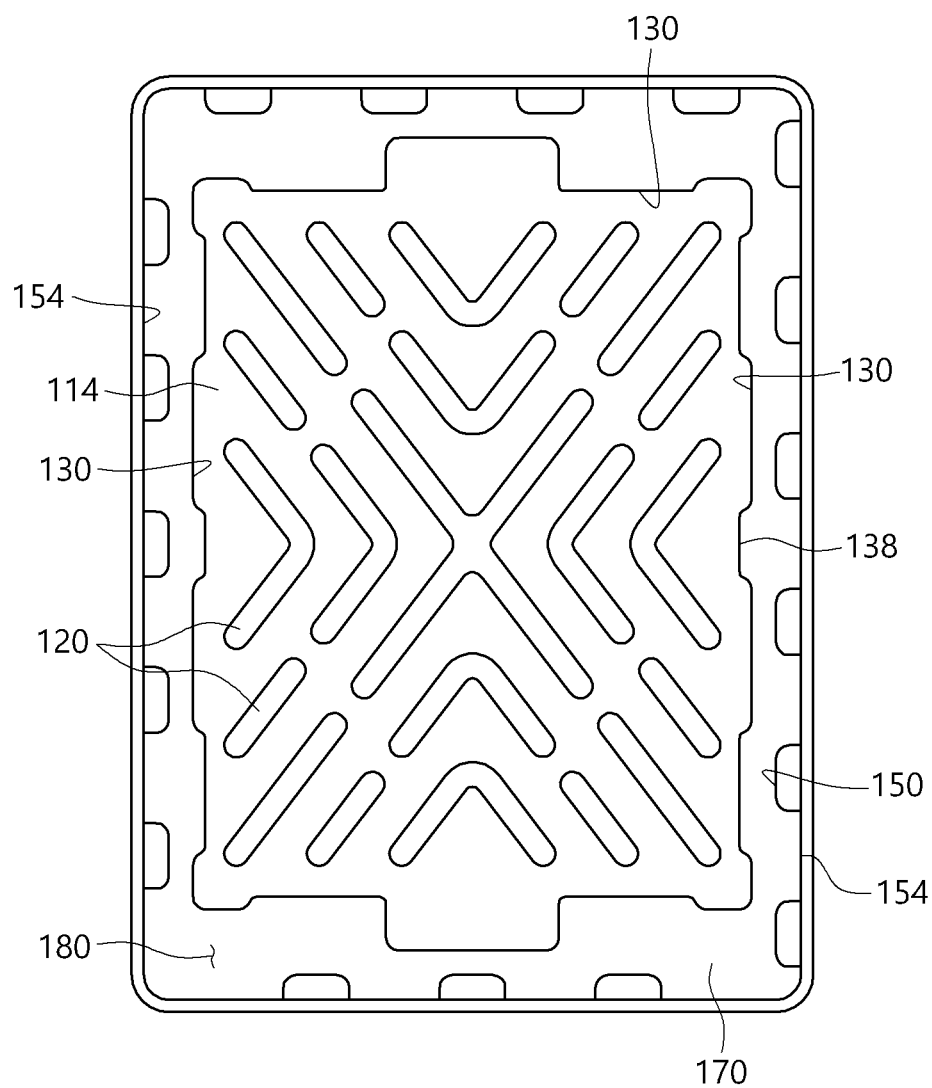
FIG. 3 is a bottom view of FIG. 1.

As shown in FIGS. 1 to 3, a substrate tray 100 according to one embodiment of the present invention may include an accommodation part 110 and a support part.

The substrate tray 100 of the present embodiment is for accommodating a ceramic substrate 10. The ceramic substrate 10 is a circuit board in which a metal foil is brazed and formed on one or two surfaces of one surface and the other surface of a ceramic substrate.

The ceramic substrate 10 has an excellent heat dissipation effect due to the metal foil so that the ceramic substrate 10 is used for power semiconductor mounting substrates or the like in which heat dissipation is important.

In addition, a break-off line may be formed on the ceramic substrate during initial production so that the ceramic substrate 10 may be formed to be divided into a plurality of pieces later.

In order to transport the produced ceramic substrate 10 to a dealer or a customer, the substrate tray 100 which can store and transport the produced ceramic substrate 10 without scratches, damage, or contamination is required.

The accommodation part 110 may have a space formed such that the ceramic substrate 10 is accommodated, and a bottom surface 114 configured to close a lower surface may be formed, and an upper portion of the accommodation part 110 may be open to form a first opening 112 such that the ceramic substrate 10 may be accommodated and withdrawn.

In addition, the support part may be formed at a peripheral portion of the accommodation part to support a periphery of a sidewall of the ceramic substrate 10 accommodated in the accommodation part 110. That is, the support part constitutes a sidewall of the accommodation part 110.

The above-described support part may include an inner wall 130, an outer wall 150, an upper surface 140, and a second opening 170.

In the present embodiment, the ceramic substrate 10 is formed in a quadrangular shape, and thus an example will be described in which the support part formed at the peripheral portion of the accommodation part 110 is also disposed such that the accommodation part constitutes the quadrangular shape. However, the present invention is not limited thereto, and when the ceramic substrate has a triangular shape or a polygonal shape having a quadrangle or more, the support part may also be disposed according to the shape of the ceramic substrate.

The accommodation part 110 and the support part may be integrally formed through an injection molding process using a synthetic resin material such as a polypropylene (PP) or polyethylene terephthalate (PET) material. However, the present invention is not necessarily limited to the above materials, and if necessary, the accommodation part 110 and the support part may be formed of different materials or may be formed as separate parts and then assembled to form the substrate tray.

As described above, the support part may include the inner wall 130, the outer wall 150, and the upper surface 140.

The inner wall 130 may be formed to extend upward from the bottom surface 114 of the support part and to constitute a side surface of the accommodation part 110.

The outer wall 150 may be formed at a position that is spaced outward from the inner wall 130 by a certain distance.

The upper surface 140 for connecting an upper end portion of the inner wall 130 and an upper end portion of the outer wall 150 may be formed. That is, the upper surface 140 may extend outward from the upper end portion of the inner wall 130, and the outer wall 150 may be formed to extend downward from an outer edge of the upper surface 140.

In addition, between the inner wall 130 and the outer wall 150, the second opening 170, which is open in a direction opposite to a direction in which the first opening 112 is open, may be formed at a position opposite to the upper surface 140. That is, an open hollow space 180 may be formed between the inner wall 130, the upper surface 140, and the outer wall 150.

Accordingly, the inner wall 130, the upper surface 140, and the outer wall 150 may have a cross section with a "∩" shape.

Figure 5:
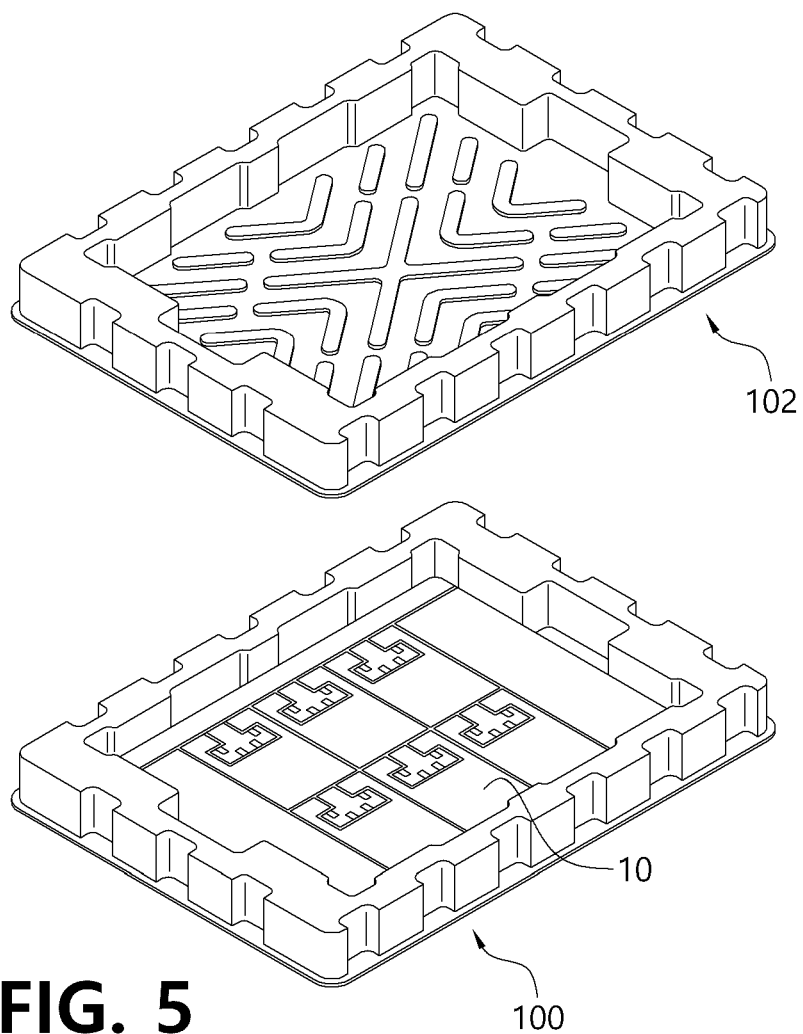
FIG. 5 is a perspective view illustrating a state in which another substrate tray is coupled to an upper side of a substrate tray in which an active metal brazing (AMB) substrate is accommodated.

As shown in FIG. 5, an inner wall 130, an upper surface 140, and an outer wall 150 of another substrate tray 102 may be inserted into and coupled to the open hollow space 180 surrounded by the inner wall 130, the upper surface 140, and the outer wall 150.

In addition, a flange portion 160 may be formed at a lower end of the outer wall 150. The flange portion 160 may be formed to extend outward from the lower end of the outer wall 150 in an outer direction opposite to the accommodation part 110. The flange portion 160 may improve the rigidity of the outer wall 150 and may allow the substrate tray 100 in a state of being stacked and coupled to be easily separated.

In the present embodiment, an example is described in which the inner wall 130 has a distance of 172 mm×130 mm, but the present invention is not necessarily limited thereto. The distance of the inner wall 130 may be formed differently according to a size of the ceramic substrate 10 accommodated in the accommodation part 110.

In addition, a depth of the accommodation part 110, that is, a height of the inner wall 130, may be a depth enough to accommodate about 10 to 15 ceramic substrates 10 in the accommodation part 110. However, the height of the inner wall 130 has a numerical value that may be changed according to the requirements for a product and a weight and thickness of the ceramic substrate 10.

Meanwhile, one or more bottom protrusions 120 may be formed on the bottom surface 114 of the accommodation part 110. The bottom protrusion 120 may separate the ceramic substrate 10 accommodated in the accommodation part 110 from the bottom surface of the accommodation part 110 to prevent the transmission of an impact and may be provided to absorb an impact due to elasticity of a material itself of the bottom protrusion 120.

Figure 4:
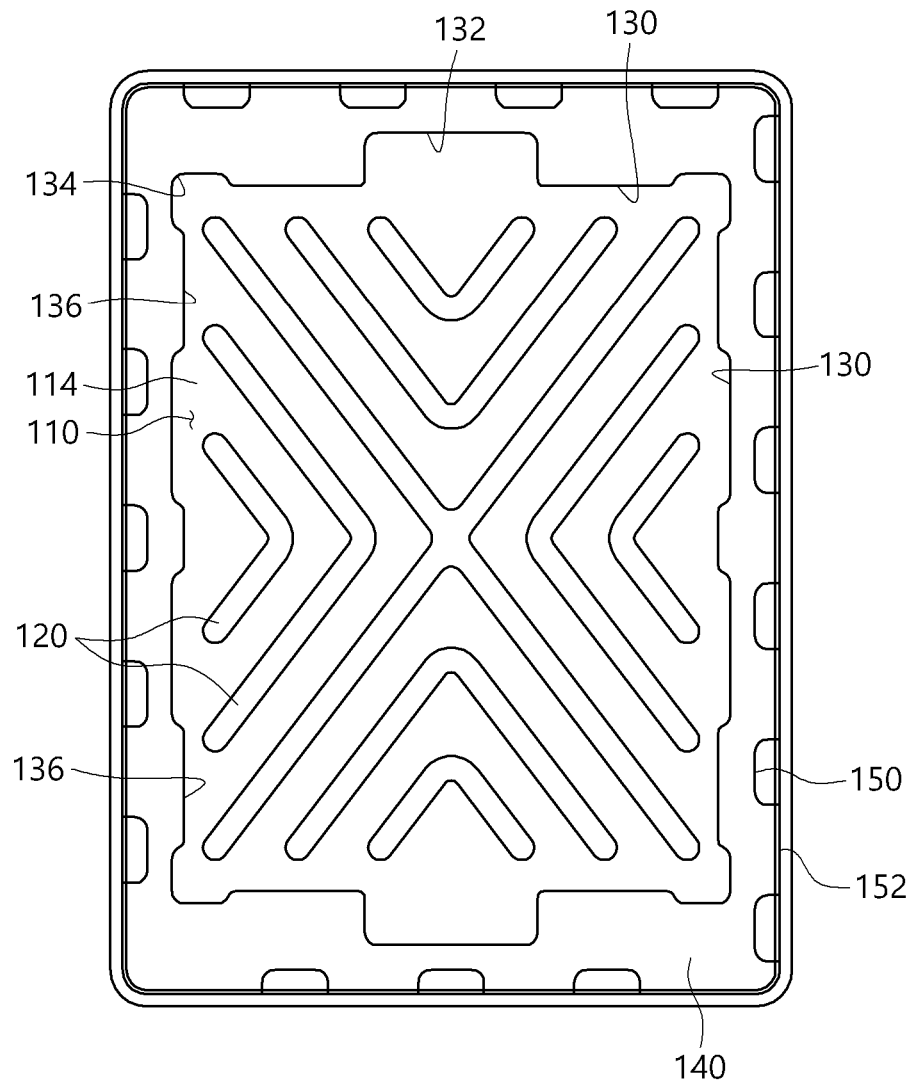
FIG. 4 is a bottom view illustrating another shape of a bottom protrusion of FIG. 1.

As shown in FIGS. 1 to 3, the bottom protrusion 120 may be formed in a shape of a straight line or a shape of two straight lines (bent straight line shape or X shape) that intersect at a certain angle, and a plurality of bottom protrusions 120 may be formed apart from each other. Of course, as shown in FIG. 4, the bottom protrusions 120, which have a shape of two straight lines (bent straight line shape or X shape) that intersect at a certain angle, may be disposed apart from each other.

The bottom protrusion 120 absorbs an impact and at the same time minimizes a contact area with the ceramic substrate 10, thereby preventing contamination from occurring. In addition, the bottom protrusion 120 may separate the bottom surface 114 of the accommodation part 110 from the ceramic substrate 10, thereby preventing scratches from being generated on the ceramic substrate 10 due to the introduction of any foreign materials.

In addition, grip grooves 132 may be formed in the inner wall 130. The grip groove 132 may form a space into which a picker for picking the ceramic substrate 10 accommodated in or withdrawn from the accommodation part 110 may enter.

The grip grooves 132 may be symmetrically formed at positions facing each other in the inner wall 130.

In addition, corner grooves 134 may be formed. The corner grooves 134 formed to be recessed toward the outside of the accommodation part 110 may be formed at four corners of the accommodation part 110, that is, at points at which the inner walls 130 meet.

The corner groove 134 is for protecting an edge of the ceramic substrate 10 accommodated in the accommodation part 110 and forms a gap such that the corner of the ceramic substrate 10, on which stress can be concentrated, is not in contact with the inner wall 130 of the accommodation part 110, thereby preventing damage to the ceramic substrate 10.

In this case, a corner portion of the corner groove 134 may be curved with a set curvature. In the present embodiment, an example is described in which a radius of curvature of the corner portion of the corner groove 134 is 3.0 mm. However, the present invention is not necessarily limited thereto, and the radius of curvature of the corner portion may be formed to have other numerical values.

Outer protrusions 152 may be formed on an outer surface of the outer wall 150. A plurality of outer protrusions 152 may be horizontally formed spaced apart from each other by a certain interval and may be formed to vertically have a longitudinal direction. The outer protrusion 152 may serve to reinforce strength and also to guide a coupling position of a pair of substrate trays 100 and 102, when the pair of substrate trays 100 and 102 are vertically coupled, together with an outer accommodation groove to be described below.

Meanwhile, in order to accommodate the outer protrusions 152, a plurality of outer accommodation grooves 154 vertically having a longitudinal direction in a shape corresponding to a shape of the outer protrusion 152 may be formed at a horizontal interval apart from each other at positions corresponding to the outer protrusions 152 on an inner surface of the outer wall 150.

Accordingly, when the pair of substrate trays 100 and 102 are vertically stacked, the outer protrusion 152 of the substrate tray 100 positioned at a lower side may be accommodated in and coupled to the outer accommodation groove 154 of the substrate tray 102 positioned at an upper side.

Since both the outer protrusion 152 and the outer accommodation groove 154 vertically have a longitudinal direction, the outer protrusion 152 and the outer accommodation groove 154 may not interfere with vertical coupling and may guide a coupling position of the substrate tray 102 positioned at an upper side and the substrate tray 100 positioned at a lower side.

In addition, side protrusions 136 may be formed on an outer surface of the inner wall 130 facing the accommodation part. The side protrusion 136 may be formed to protrude in a direction from the surface of the inner wall 130 toward the inner side of the accommodation part 110.

One or more side protrusions 136 may be formed apart from each other. In this case, a surface of the side protrusion 136 facing the accommodation part 110 is formed to be flat, thereby stably supporting a side surface of the ceramic substrate 10 accommodated in the accommodation part 110.

Since the side protrusion 136 is provided, the side protrusion 136 rather than an entire surface of the inner wall 130 supports the ceramic substrate 10 in a small area, thereby minimizing a possibility of contamination while stably supporting the ceramic substrate 10. In addition, due to elasticity of a material itself, the side protrusion 136 may provide a certain fixing force to the ceramic substrate 10.

In addition, side accommodation grooves 138 corresponding to the side protrusions 136 may be formed in an inner surface of the inner wall 130. In order to accommodate the side protrusions 136, a plurality of side accommodation grooves 138 vertically having a longitudinal direction in a shape corresponding to a shape of the side protrusion 136 may be formed at a horizontal interval apart from each other at positions corresponding to the side protrusions 136.

Accordingly, when the pair of substrate trays 100 and 102 are vertically stacked, the side protrusion 136 of the substrate tray 100 positioned at a lower side may be accommodated in and coupled to the side accommodation groove 138 of the substrate tray 102 positioned at an upper side.

Since both the side protrusion 136 and the side accommodation groove 138 vertically have a longitudinal direction, the side protrusion 136 and the side accommodation groove 138 may not interfere with vertical coupling and may guide a coupling position of the substrate tray 102 positioned at an upper side and the substrate tray 100 positioned at a lower side.

Figure 6:
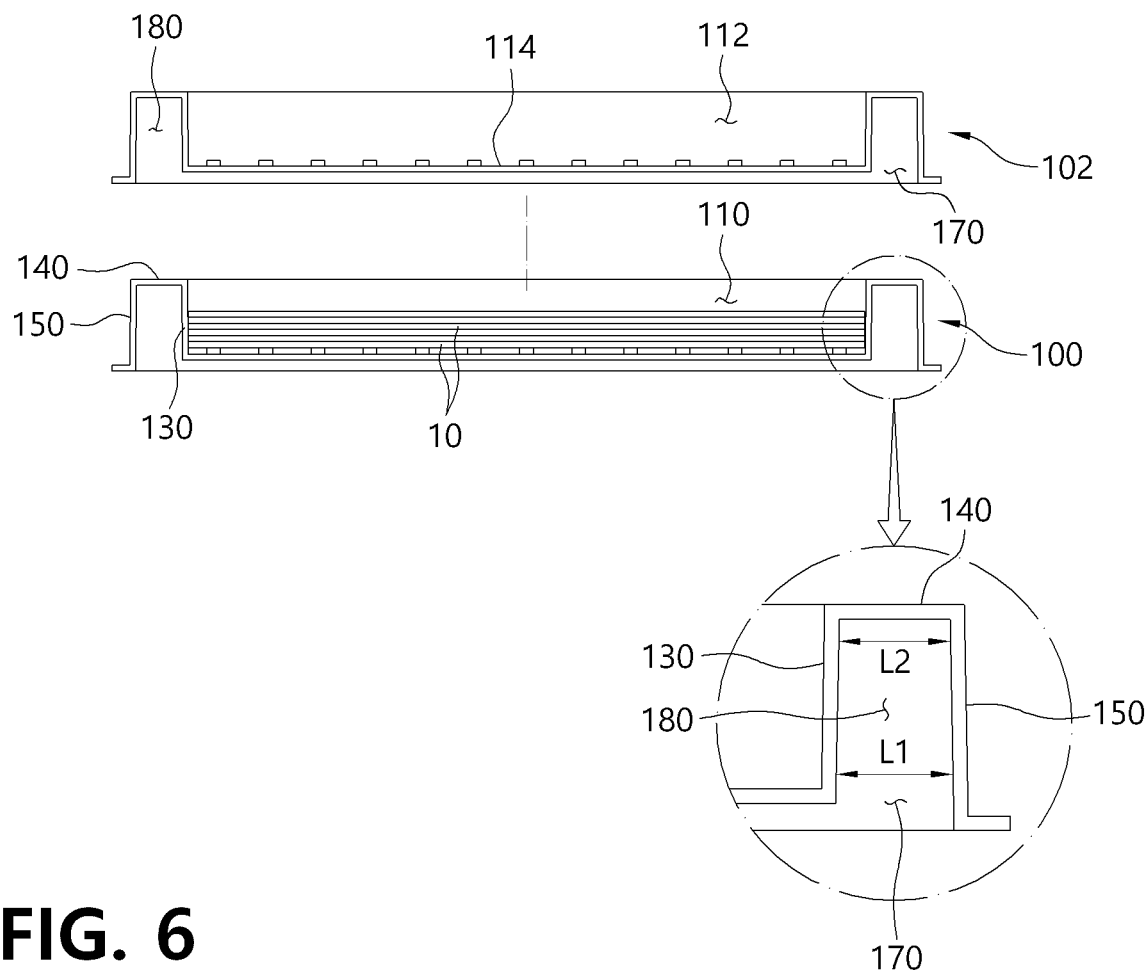
FIG. 6 is a side cross-sectional view of FIG. 5.

That is, as shown in FIG. 6, the second opening 170 may be formed between the inner wall 130, the upper surface 140, and the outer wall 150, and the open hollow space 180 may be formed therein so that the inner wall 130, the upper surface 140, and the outer wall 150 of another substrate tray 102 may be inserted into the second opening 170 and the hollow space 180. In this case, in order for the insertion to be made more smoothly, a separation interval between the inner wall 130 and the outer wall 150 may be formed in a shape with a wide lower portion and a narrow upper portion that is linearly narrowed in a direction from the second opening 170 toward the upper surface.

That is, a separation distance L1 at a side of the second opening 170 may be greater than a separation distance L2 at a side of the upper surface 140.

Accordingly, the insertion of the substrate tray 100 positioned at a lower side can be guided, and at the same time, the substrate tray 100 can be tightly fitted so that a certain fixing force may be applied.

As shown in FIGS. 5 and 6, one or more produced ceramic substrates 10 may be accommodated in the accommodation part 110 to be superimposed with each other. In a state in which the ceramic substrate is accommodated in the accommodation part 110, another substrate tray 102 may be coupled to an upper side of the accommodation part 110 to be superimposed therewith, and thus the bottom surface of the accommodation part 110 of the substrate tray 102 positioned at an upper side may cover and close the upper surface of the accommodation part 110 of the substrate tray 100 positioned at a lower side.

In this case, the inner wall 130, the upper surface 140, and the outer wall 150 of the substrate tray 100 at an upper side may be inserted into and coupled to the hollow space 180 between the inner wall 130, the upper surface 140, and the outer wall 150 of the substrate tray 102 superimposed at an upper side, and the ceramic substrate 10 may be stored to be isolated from the outside in a state of being accommodated in the accommodation part 110.

Figure 7:
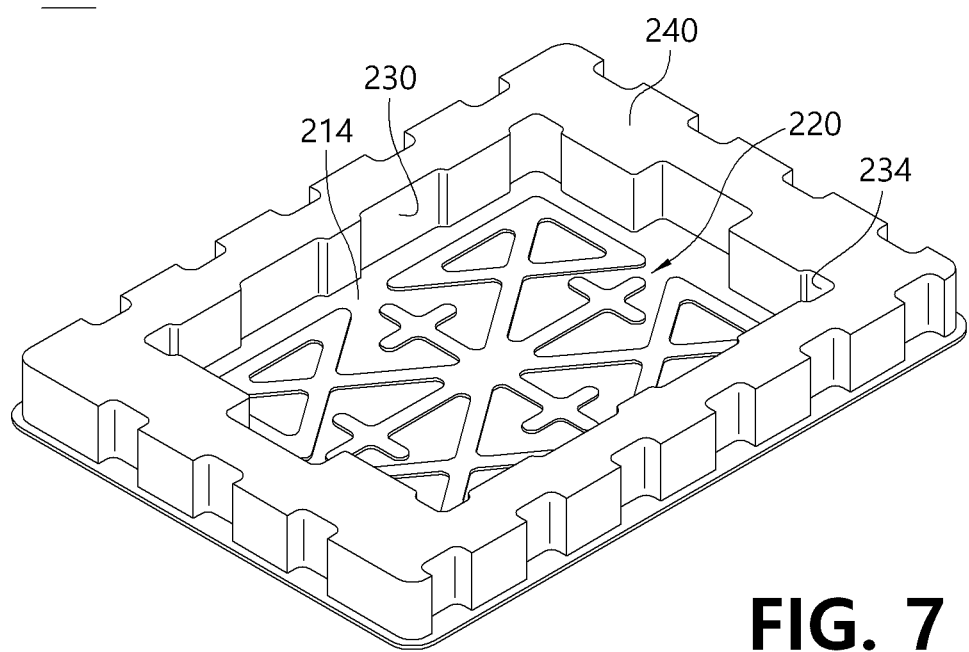
FIG. 7 is a perspective view illustrating a substrate tray according to another embodiment of the present invention.
Figure 8:
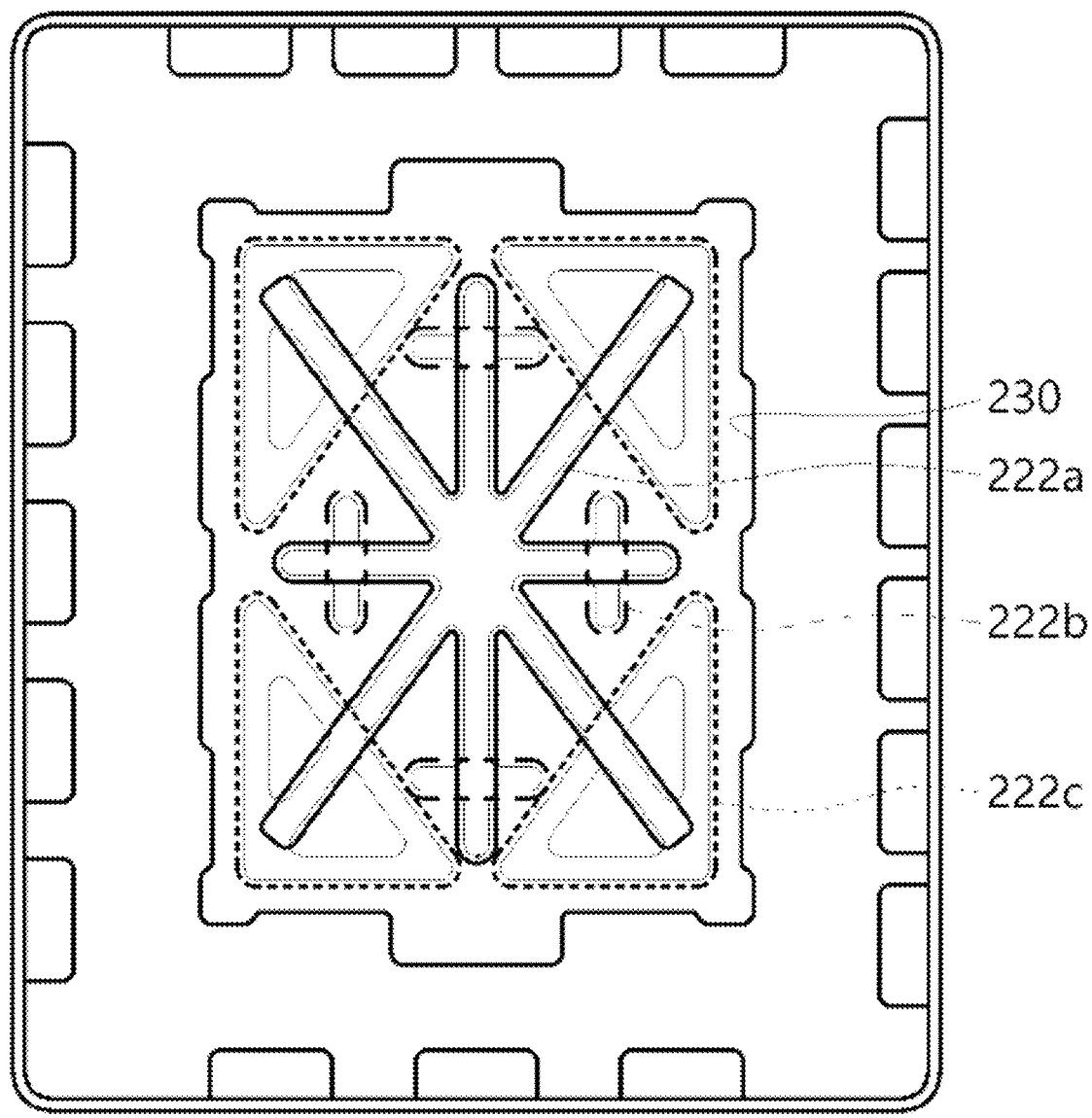
FIG. 8 is a plan view of FIG. 7.

In addition, as shown in FIGS. 7 and 8, a width of an upper surface 240 and a shape of a bottom protrusion 220 may be changed.

That is, if necessary, the width of the upper surface 240 may be wider as compared with the above-described embodiments. This may be to accommodate a ceramic substrate 10 with a smaller size in a substrate tray 200 having the same size without shaking.

Alternatively, when there is a need to further strengthen the preparation for an impact in a lateral direction in a storage environment of the ceramic substrate 10, the width of the upper surface 240 may be further increased. Alternatively, this may be to respond to a change in vertical load applied to the substrate tray 200.

Also, the shape of the bottom protrusion 220 may be changed.

The bottom protrusion 120 according to the above-described embodiment has a straight line or a combination of two straight lines bent in a "^" shape, but according to the present embodiment, the bottom protrusion 222 may include first bottom protrusions 222a, second bottom protrusions 222b, and third bottom protrusions 222c.

The first bottom protrusions 222a may have straight line shapes extending radially in eight directions on a bottom surface 214. In this case, the first bottom protrusions 222a may extend at equal angles. That is, the first bottom protrusions 222a may extend toward an inner wall 230 to be perpendicular thereto and may also extend toward a corner groove 234 of each corner at which the inner walls 230 meet.

The second bottom protrusion 222b may be formed at the first bottom protrusion 222a which extends toward an inner wall 230 to be perpendicular thereto among the first bottom protrusions 222a and may be formed to have a longitudinal direction in a direction perpendicular to the first bottom protrusion 222a.

In addition, the third bottom protrusion 222c may be formed at an end portion of the first bottom protrusion 222a which extends toward the corner groove 234 among the first bottom protrusions 222a and may be formed to have a triangular shape.

That is, the first bottom protrusions 222a, the second bottom protrusions 222b, and the third bottom protrusions 222c may be symmetrically formed with respect to a center of the bottom surface 214.

Accordingly, the ceramic substrate 10 can be stably supported by supporting the ceramic substrate 10 symmetrically.

Exemplary embodiments according to the present invention have been described above, and it is self-evident to those of ordinary skill in the art that, in addition to the above-described embodiments, the present invention may be embodied in other specific forms without departing from the gist or scope thereof. Thus, the above-described embodiments should be considered as being illustrative instead of limitative, and accordingly, the present invention is not limited to the above description and may be modified within the scope of the attached claims and their equivalents.

The invention claimed is:

1. A substrate tray for accommodating one or more ceramic substrates, comprising:
    an accommodation part which includes a first opening having an upper side that is open such that the one or more ceramic substrates can be accommodated within the accommodation part and withdrawn from the accommodation part; and
    a support part formed at a peripheral portion of the accommodation part to support a periphery of a sidewall of a first ceramic substrate of the one or more ceramic substrates,
    wherein:
    the support part includes an inner wall in contact with at least one surface of the first ceramic substrate, an outer wall spaced a certain distance from the inner wall, an upper surface configured to connect the inner wall and the outer wall, and a second opening formed to be open in a direction opposite to a direction in which the first opening is open, at a position opposite to the upper surface between the inner wall and the outer wall; and
    the substrate tray is configured such that an upper surface of a second substrate tray can be inserted through the second opening so that a first opening of an accommodation part of the second substrate tray is formed to be closed by the accommodation part of the substrate tray,
    wherein a bottom protrusion is formed on a bottom surface of the accommodation part,
    wherein the bottom protrusion includes:
        first bottom protrusions extending radially in a direction from a center of the bottom surface of the accommodation part toward the inner wall;

second bottom protrusions formed to be perpendicular to the first bottom protrusions which extend to be perpendicular to a side of the inner wall among the first bottom protrusions; and third bottom protrusions formed in a triangular shape at end portions of the first bottom protrusions which extend toward a corner of the inner wall among the first bottom protrusions.

2. The substrate tray of claim 1, wherein the substrate tray comprises a flange portion extending outward from a lower end of the outer wall in an outer direction opposite to the accommodation part.

3. The substrate tray of claim 1, wherein the bottom protrusion comprises in a straight line or two straight lines that intersect at a certain angle.

4. The substrate tray of claim 1, wherein the substrate tray comprises grip grooves formed in the inner wall and the grip grooves are configured to allow a picker to pick the first ceramic substrate.

5. The substrate tray of claim 4, wherein the grip grooves are formed at symmetrical positions along the inner wall facing each other.

6. The substrate tray of claim 1, wherein the substrate tray comprises a corner groove recessed towards an outside of the accommodation part and the corner groove is formed in a corner at a point at which the inner walls meet.

7. The substrate tray of claim 6, wherein a corner portion of the corner groove is formed to be curved with a set curvature.

8. The substrate tray of claim 1, wherein the substrate tray comprises a plurality of outer protrusions vertically having a longitudinal direction are and protruding from an outer surface of the outer wall to be horizontally spaced from each other.

9. The substrate tray of claim 8, wherein, in order to accommodate the outer protrusions, the substrate tray comprises a plurality of outer accommodation grooves vertically having a longitudinal direction and formed in an inner surface of the outer wall at positions corresponding to the outer protrusions to be spaced a horizontal interval from each other.

10. The substrate tray of claim 1, wherein a separation interval between the outer wall and the inner wall is formed in a shape having a wide lower portion and a narrow upper portion that is gradually narrowed toward the upper surface.

* * * * *